United States Patent
Hao

(10) Patent No.: US 11,215,200 B2
(45) Date of Patent: Jan. 4, 2022

(54) OSCILLATING FAN AND ELECTRONIC DEVICE HAVING THE SAME

(71) Applicant: Lenovo (Beijing) Co., Ltd., Beijing (CN)

(72) Inventor: Jingyang Hao, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 56 days.

(21) Appl. No.: 16/365,508

(22) Filed: Mar. 26, 2019

(65) Prior Publication Data

US 2019/0301442 A1 Oct. 3, 2019

(30) Foreign Application Priority Data

Mar. 27, 2018 (CN) .......................... 201810257043.6

(51) Int. Cl.
| | | |
|---|---|---|
| *F04D 33/00* | (2006.01) | |
| *H05K 7/20* | (2006.01) | |
| *G06F 1/20* | (2006.01) | |

(52) U.S. Cl.
CPC ......... *F04D 33/00* (2013.01); *H05K 7/20154* (2013.01); *H05K 7/20172* (2013.01); *F05D 2250/75* (2013.01); *G06F 1/203* (2013.01)

(58) Field of Classification Search
CPC ........ F04D 33/00; F04B 45/047; F04B 45/10; H05K 7/20154; H05K 7/20172; G06F 1/203
See application file for complete search history.

(56) References Cited

U.S. PATENT DOCUMENTS

| | | | | | |
|---|---|---|---|---|---|
| 4,063,826 | A | * | 12/1977 | Riepe ..................... | F04D 33/00 417/410.1 |
| 5,522,712 | A | * | 6/1996 | Winn ...................... | F04D 33/00 310/25 |
| 7,321,184 | B2 | * | 1/2008 | Lee ......................... | F04D 33/00 310/328 |
| 9,510,480 | B2 | * | 11/2016 | Zhang ................ | H05K 7/20172 |
| 9,572,281 | B2 | * | 2/2017 | Roebke ................ | F04B 49/065 |
| 9,932,992 | B2 | * | 4/2018 | Takeda .................. | F04D 25/08 |
| 10,184,493 | B2 | * | 1/2019 | Nguyen ............... | F04B 43/046 |
| 10,804,783 | B2 | * | 10/2020 | Feng ................. | F04D 25/0606 |
| 2008/0286133 | A1 | * | 11/2008 | He ........................ | F04B 35/04 417/415 |

(Continued)

FOREIGN PATENT DOCUMENTS

| | | |
|---|---|---|
| CN | 2930218 Y | 8/2007 |
| CN | 201037478 Y | 3/2008 |

(Continued)

OTHER PUBLICATIONS

English translation of JP2002339900 (Year: 2020).*

*Primary Examiner* — Topaz L. Elliott
(74) *Attorney, Agent, or Firm* — Anova Law Group, PLLC

(57) ABSTRACT

An oscillating fan includes a base, a plurality of heat sink fins arranged at the base and forming air outlet passages between the plurality of heat sink fins, a blade oscillating in a direction parallel to the plurality of heat sink fins, and a driving mechanism configured to drive the blade to oscillate, such that an airflow enters from a side of the blade distal from the plurality of heat sink fins and blows toward the plurality of heat sink fins.

8 Claims, 4 Drawing Sheets

(56) References Cited

U.S. PATENT DOCUMENTS

| | | | |
|---|---|---|---|
| 2009/0072637 A1* | 3/2009 | Chang | F04D 33/00 310/36 |
| 2009/0074571 A1* | 3/2009 | Jang | F04D 33/00 415/208.1 |
| 2009/0213555 A1* | 8/2009 | Wang | F04D 29/582 361/719 |
| 2011/0014069 A1* | 1/2011 | Wada | F04D 33/00 417/410.2 |
| 2016/0312802 A1* | 10/2016 | Takeda | F04D 33/00 |
| 2017/0254336 A1 | 9/2017 | Nguyen | |
| 2017/0299276 A1* | 10/2017 | Su | F28F 13/125 |
| 2018/0269371 A1* | 9/2018 | Franke | H01L 35/30 |
| 2020/0025217 A1* | 1/2020 | Lucas | H02K 7/14 |

FOREIGN PATENT DOCUMENTS

| | | |
|---|---|---|
| CN | 102072137 A | 5/2011 |
| CN | 107313994 A | 11/2017 |
| JP | 2002339900 A | 11/2002 |

* cited by examiner

OSCILLATING FAN AND ELECTRONIC DEVICE HAVING THE SAME

CROSS-REFERENCE TO RELATED APPLICATION

This application claims priority to Chinese Application No. 201810257043.6, filed on Mar. 27, 2018, the entire contents of which are incorporated herein by reference.

FIELD OF THE DISCLOSURE

The present disclosure relates to fan technology and, more particularly, to an oscillating fan and an electronic device having the same.

BACKGROUND

The conventional oscillating fan includes heat sink fins, a magnet, and two blades arranged at two sides of the magnet. The two blades are parallel to the heat sink fins, and the two blades include blade magnets. After being powered on, the blades oscillate in a direction perpendicular to the heat sink fins under the effect of an alternating magnetic field. However, the vortex formed by the oscillation of the blades is moving forward and oscillating in a direction perpendicular to the heat sink fins. As such, the vortex can be cut and broken after encountering the heat sink fins, thereby causing a large flow resistance and affecting the heat dissipation effect.

Furthermore, an air inlet area in a direction along which the blades distal from the heat sink fins is blocked by the magnet, thereby also causing the formation of the flow resistance. The disclosed methods and systems are directed to solve one or more problems set forth above and other problems.

SUMMARY

In accordance with the disclosure, there is provided an oscillating fan including a base, a plurality of heat sink fins arranged at the base and forming air outlet passages between the plurality of heat sink fins, a blade oscillating in a direction parallel to the plurality of heat sink fins, and a driving mechanism configured to drive the blade to oscillate, such that an airflow enters from a side of the blade distal from the plurality of heat sink fins and blows toward the plurality of heat sink fins.

Also in accordance with the disclosure, there is provided an electronic device including an oscillating fan. The oscillating fan includes a base, a plurality of heat sink fins arranged at the base and forming air outlet passages between the plurality of heat sink fins, a blade oscillating in a direction parallel to the plurality of heat sink fins, and a driving mechanism configured to drive the blade to oscillate, such that an airflow enters from a side of the blade distal from the plurality of heat sink fins and blows toward the plurality of heat sink fins.

Other aspects of the present disclosure can be understood by those skilled in the art in light of the description, the claims, and the drawings of the present disclosure.

BRIEF DESCRIPTION OF THE DRAWINGS

In order to provide a clearer illustration of embodiments of the present disclosure, brief descriptions of the drawings of the present disclosure are provided. The following drawings merely illustrate embodiments of the present disclosure. Other drawings may be obtained based on the disclosed drawings by those skilled in the art without creative efforts.

DETAILED DESCRIPTION

Hereinafter, embodiments of the present disclosure are described with reference to the drawings. It is apparent that the disclosed embodiments are merely some but not all of embodiments of the present disclosure. Other embodiments of the present disclosure may be obtained based on the embodiments disclosed herein by those skilled in the art without creative efforts, which are intended to be within the scope of the present disclosure.

Figure 1:
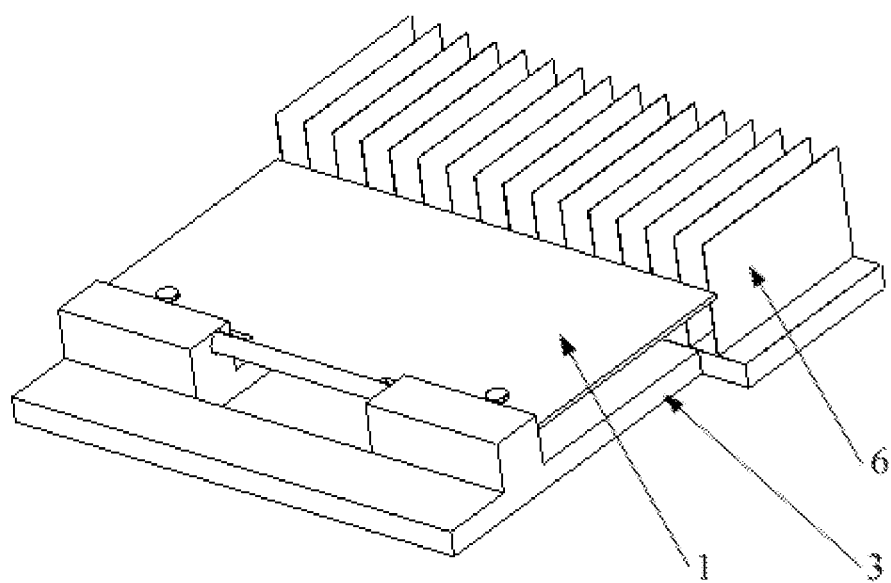
FIG. 1 is a schematic structure diagram of an oscillating fan according to the present disclosure.
Figure 2:
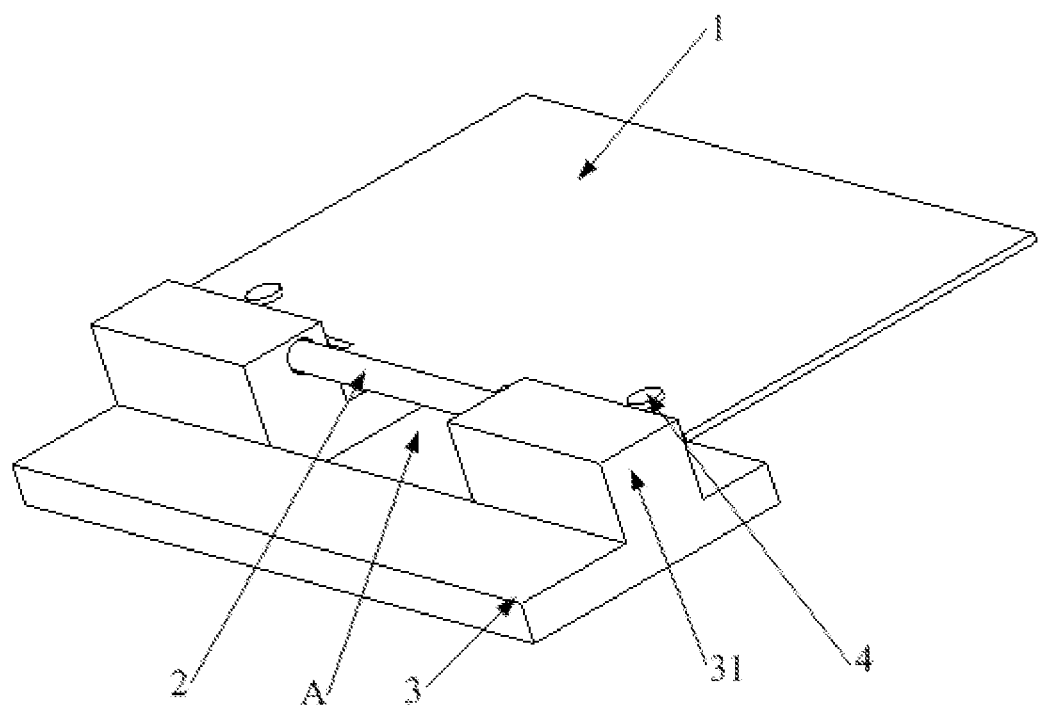
FIG. 2 is a perspective view showing a partial structure of an oscillating fan according to the present disclosure.
Figure 3:
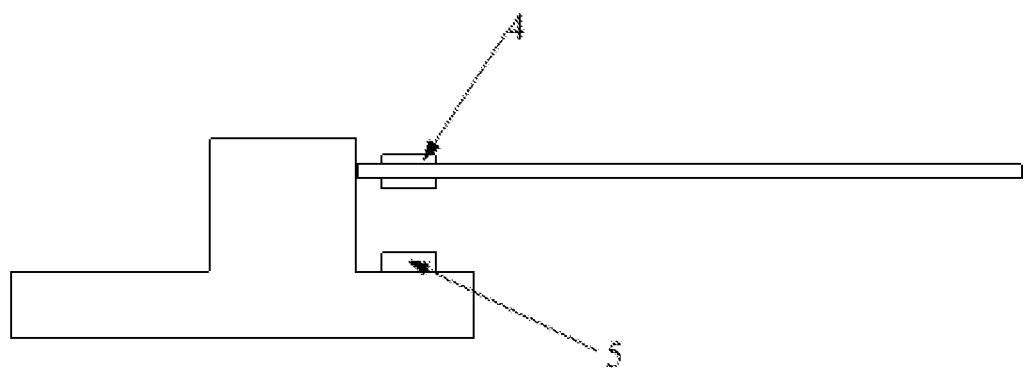
FIG. 3 is a side view of the oscillating fan in FIG. 1.

The present disclosure provides an improved oscillating fan that can reduce a flow resistance of a vortex formed by an oscillation of a blade, thereby improving a heat dissipation effect. FIG. 1 is a schematic structure diagram of an oscillating fan consistent with the present disclosure. FIG. 2 is a perspective view showing a partial structure of the oscillating fan in FIG. 1. FIG. 3 is a side view of the oscillating fan in FIG. 1.

As shown in FIGS. 1 to 3, the oscillating fan includes a base 3 and a plurality of heat sink fins 6. Air outlet passages can be formed between the plurality of heat sink fins 6. The oscillating fan further includes a blade 1 that can oscillate in a direction parallel to the plurality of heat sink fins 6 to blow air into the air outlet passages, and a driving mechanism configured to drive the blade 1 to oscillate.

A direction of the plurality of heat sink fins 6 refers to an arrangement direction of the plurality of heat sink fins 6, e.g., the direction of a board surface of the plurality of heat sink fins 6. The base 3 can be an original base of the fan, or can be a separate branch base that can be detachably fixed to the base of the fan to facilitate an installation of the blade 1.

During operation, the airflow can enter from a side of the blade 1 distal from the plurality of heat sink fins 6, go through the blade 1, and blow toward the plurality of heat sink fins 6, thereby accelerating a heat exchange between the airflow and the plurality of heat sink fins 6 and improving the heat dissipation efficiency.

Consistent with the present disclosure, the blade 1 can be driven to oscillate in the direction parallel to the plurality of heat sink fins 6 by the driving mechanism, such that the flow resistance of the vortex formed by the oscillation of the blade 1 can be reduced, and the outlet air of the blade 1 can smoothly pass through the air outlet passages between the plurality of heat sink fins 6 without being disturbed, thereby improving the heat dissipation effect.

In some embodiments, the plurality of heat sink fins 6 can be perpendicular to the base 3, and the blade 1 can be perpendicular to the plurality of heat sink fins 6. For example, the base 3 can be arranged in a horizontal direction, the plurality of heat sink fins 6 can be arranged in a vertical direction, and the blade 1 can be arranged in the horizontal direction and can oscillate in an up and down direction.

The above-described arrangement manner can facilitate an arrangement of the plurality of heat sink fins 6 and the blade 1, and an amplitude of the oscillation of the blade 1 and an oscillating area of the fan can be large, thereby improving the heat dissipation efficiency. The blade 1 can have a flat structure that is easy to be processed. In some embodiments, the plurality of heat sink fins 6 can also have other angles relative to the base 3, such as 80 degrees or 100 degrees. The blade 1 might not be perpendicular to the plurality of heat sink fins 6, such as having an angle of 100 degrees relative to the plurality of heat sink fins 6. The blade 1 may have a curved blade, a bent shape, or may be formed by connecting a plurality of folds, or the like, as long as the blade 1 can oscillate in the direction parallel to the plurality of heat sink fins 6.

In order to improve a compactness of the structure, as shown in FIG. 3, the driving mechanism includes a first magnet 4 arranged at the blade 1 and a second magnet 5 that can cooperate with the first magnet 4 to drive the blade 1 to oscillate. The second magnet 5 is arranged at the base 3. A direction of an interaction force between the first magnet 4 and the second magnet 5 can be parallel to the plurality of heat sink fins 6 to ensure an oscillation direction of the blade 1. The first magnet 4 can be referred as a first-type magnet and the second magnet 5 can be referred as a second-type magnet.

The second magnet 5 can generate an alternating magnetic field by passing an alternating current to the second magnet 5. The alternating magnetic field can generate an alternating magnetic attraction force to the first magnet 4, thereby causing the blade 1 fixedly coupled to the first magnet 4 to oscillate in the direction parallel to the plurality of heat sink fins 6. In some embodiments, the alternating current can be passed to the first magnet 4. One of the first magnet 4 and the second magnet 5 to which the alternating current is passed may include a permanent magnet or an electromagnet.

In some embodiments, the driving mechanism can also have other structures, such as a motor, an electric push rod, or a driving cylinder, to achieve the same effect of driving the blade 1 to oscillate and details are omitted herein.

In order to simplify the structure, the number of the blade 1 can be one. The blade 1 can be arranged at a side of the second magnet 5 distal from the base 3 and can extend from an end of the plurality of heat sink fins 6 to another end of the plurality of heat sink fins 6. As shown in FIG. 3, the blade 1 is arranged at an upper side of the second magnet 5 and has the large oscillating area of the fan, such that the air flow can be blown into all the air outlet passages between the plurality of heat sink fins 6, thereby ensuring a uniformity of the heat dissipation of the plurality of heat sink fins 6. The blade 1 may also be arranged at a lower side of the second magnet 5. According to the actual applications, the number of the blade 1 can also be other numbers, such as two. The two blades 1 can be spaced apart in the same horizontal direction.

In some embodiments, in order to obtain a large oscillating volume, the blade 1 can have a sector shape or a rectangular shape, which can be easy to arrange and process. The blade 1 can also have other shapes, such as a trapezoid shape, an ellipse shape, or the like.

The plurality of heat sink fins 6 can also include a mounting notch close to an end of the blade 1, such that an oscillating end of the blade 1 can extend into the plurality of heat sink fins 6 to obtain a larger area of the blade 1, thereby further increasing the air volume of the blade 1 and increasing the amplitude of the oscillation of the blade 1.

In order to ensure desired heat dissipation efficiency, the plurality of heat sink fins 6 can be arranged under the blade 1 to increase the area of the plurality of heat sink fins 6, and simultaneously blow the air directly into the plurality of heat sink fins 6, and the heat dissipation effect can be better.

As shown in FIG. 2, two first magnets 4 are arranged at two ends of the blade 1. As such, each end of the blade 1 can be engaged with the second magnet 5 through the first magnet 4 to generate an oscillation force, and the performance of the oscillation can be better. The two first magnets 4 can be referred as a first first-type magnet and a second first-type magnet. According to the size of the blade 1, various number the first magnets 4 may be provided, such as one, arranged in the middle of the blade 1, or three, evenly distributed on the blade 1. For description purpose, a first magnet 4 may be referred as a first-type magnet 4, and a second magnet 5 may be referred as a second-type magnet 5.

In some embodiments, the second magnet 5 can include a U-shape magnet, and two ends of the U-shape magnet can cooperate with the two first magnets 4, respectively. The structure can be simplified by cooperating the U-shape magnet simultaneously with the two first magnets 4. In some embodiments, the second magnet 5 can also include two cylindrical magnets.

In addition, the U-shape magnet can be embedded in the base 3. As such, the U-shape magnet can be built in, which can leave the space behind the blade 1 and increase an air intake area. The U-shape magnet can also protrude from the base 3.

In some embodiments, as shown in FIG. 2, the base 3 includes two columns 31, and the air inlet passage A can be formed between the two columns, and the two ends of the blade 1 are respectively arranged at the two columns 31. Consistent with the present disclosure, the blade 1 can be mounted through the two columns 31, and the air inlet passage A between the two columns 31 can ensure the air inlet area and improve the heat dissipation performance. The two columns 31 can increase a mounting height of the blade 1, thereby increasing the amplitude of the oscillation of the blade 1, and at the same time ensuring a stability of the blade 1. In some embodiments, the base 3 can include a mounting boss, such that a plurality of ventilation holes can be arranged on the mounting boss to achieve the same effect of ensuring the air inlet area.

In order to improve an oscillation ability of the blade 1, as shown in FIG. 2, the oscillating fan can further include an oscillating shaft 2 arranged at the blade 1, and two ends of the oscillating shaft 2 can be rotatably passed through the two columns 31, respectively. The oscillation of the blade 1 can be realized by the rotation of the oscillating shaft 2 with respect to the columns 31, and a reliability of the oscillation can be relatively high. In some embodiments, a cylindrical boss that is rotatably cooperated with the columns 31 can be provided at the two ends of the blade 1. The blade 1 can also be hinged to the columns 31. The blade 1 may also be fixed to the column 31 and oscillated by an elastic deformation of the blade 1.

Figure 4:
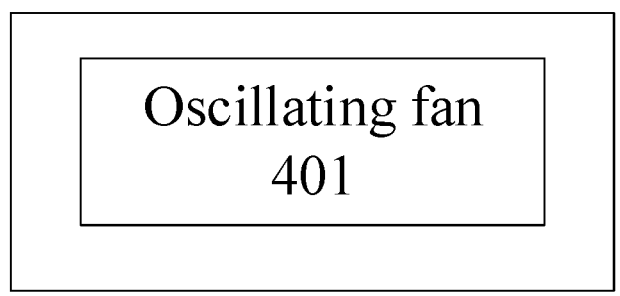
FIG. 4 illustrates an electronic device with an oscillating fan according to the present disclosure.

An electronic device consistent with the present disclosure can include the fan. FIG. 4 is a schematic diagram of an electronic device 400 with an oscillating fan 401 consistent the disclosure. The oscillating fan 401 can include any oscillating fan described above. The flow resistance caused by the vortex formed by the oscillation of the blade can be reduced, thereby improving the heat dissipation effect. Reference can be made to the relevant part described above and details are omitted herein.

In some embodiments, the oscillating fan 401 can be arranged inside the electronic device 400. In some other embodiments, the oscillating fan 401 can be arranged outside the electronic device 400 and can contact with a side of the electronic device 400.

The electronic device 400 can include a laptop, a tablet computer, or the like.

In the present disclosure, the embodiments are described in a gradual and progressive manner with the emphasis of each embodiment on an aspect different from other embodiments. For the same or similar parts between the various embodiments, reference may be made to each other.

The foregoing description of the disclosed embodiments will enable a person skilled in the art to realize or use the present disclosure. Various modifications to the embodiments will be apparent to those skilled in the art. The general principles defined herein may be implemented in other embodiments without departing from the spirit or scope of the present disclosure. Accordingly, the present disclosure will not be limited to the embodiments shown herein, but is to meet the broadest scope consistent with the principles and novel features disclosed herein.

What is claimed is:

1. An oscillating fan comprising:
a base;
a plurality of heat sink fins arranged at the base;
a blade, having a first edge distal from the heat sink fins, oscillating over the base, in a direction parallel to the plurality of heat sink fins;
two columns affixed to the base allowing an airflow to form between the two columns;
an oscillating shaft attached to the blade near the first edge of the blade, two ends of the oscillating shaft being pivotably supported by the two columns; and
a driving assembly comprising a pair of first-type magnets disposed on a first side and near the first edge of the blade, and a second-type magnet to be magnetically coupled with the pair of first-type magnets to drive the blade to oscillate, such that the airflow at least partially enters between the two columns and blows toward the plurality of heat sink fins;
wherein:
the second-type magnet is embedded in the base;
the second-type magnet is a U-shape magnet; and
each of two ends of the U-shape magnet cooperates with a corresponding one of the pair of first-type magnets.

2. The fan according to claim 1, wherein:
the plurality of heat sink fins are perpendicular to the base; and
the blade is perpendicular to the plurality of heat sink fins.

3. The fan according to claim 1, wherein:
the blade is arranged at a side of the second-type magnet distal from the base and extends from an end of the plurality of heat sink fins to another end of the plurality of heat sink fins.

4. The fan according to claim 3, wherein:
the blade has a sector shape or a rectangular shape.

5. An electronic device, comprising:
an oscillating fan, wherein the oscillating fan includes:
a base;
a plurality of heat sink fins arranged at the base and forming passages for an airflow between the plurality of heat sink fins;
a blade, having a first edge distal from the heat sink fins, oscillating over the base, in a direction parallel to the plurality of heat sink fins;
two columns affixed to the base allowing the airflow to form between the two columns;
an oscillating shaft attached to the first edge of the blade, two ends of the oscillating shaft being pivotably supported by the two columns; and
a driving assembly comprising a pair of first-type magnets disposed on a first side and near the first edge of the blade, and a second-type magnet to be magnetically coupled with the pair of first-type magnets to drive the blade to oscillate, such that the airflow at least partially enters from between the two columns and blows toward the plurality of heat sink fins;
wherein:
the second-type magnet is embedded in the base;
the second-type magnet is a U-shape magnet; and
each of two ends of the U-shape magnet cooperates with a corresponding one of the pair of first-type magnets.

6. The electronic device according to claim 5, wherein:
the plurality of heat sink fins are perpendicular to the base; and
the blade is perpendicular to the plurality of heat sink fins.

7. The electronic device according to claim 5, wherein:
the blade is arranged at a side of the second-type magnet distal from the base and extends from an end of the plurality of heat sink fins to another end of the plurality of heat sink fins.

8. The electronic device according to claim 7, wherein:
the blade has a sector shape or a rectangular shape.

* * * * *